(12) United States Patent
Vurpillot et al.

(10) Patent No.: US 8,276,210 B2
(45) Date of Patent: Sep. 25, 2012

(54) TOMOGRAPHIC ATOM PROBE COMPRISING AN ELECTRO-OPTICAL GENERATOR OF HIGH-VOLTAGE ELECTRICAL PULSES

(75) Inventors: François Vurpillot, Rouen (FR); Alain Bostel, Le Petit Quevilly (FR)

(73) Assignees: Cameca, Gennevilliers (FR); CNRS, Paris (FR)

( * ) Notice: Subject to any disclaimer, the term of this patent is extended or adjusted under 35 U.S.C. 154(b) by 0 days.

(21) Appl. No.: 13/130,520

(22) PCT Filed: Oct. 13, 2009

(86) PCT No.: PCT/EP2009/063346
§ 371 (c)(1),
(2), (4) Date: Jun. 9, 2011

(87) PCT Pub. No.: WO2010/057721
PCT Pub. Date: May 27, 2010

(65) Prior Publication Data
US 2011/0260046 A1    Oct. 27, 2011

(30) Foreign Application Priority Data
Nov. 21, 2008  (FR) .................................... 08 06550

(51) Int. Cl.
*G01Q 60/00*    (2010.01)
(52) U.S. Cl. ................. 850/21; 850/5; 850/10; 250/306; 250/307; 250/308; 250/310
(58) Field of Classification Search ............... 850/5, 10, 850/21; 250/306, 307, 308, 310
See application file for complete search history.

(56) References Cited

U.S. PATENT DOCUMENTS

| | | | |
|---|---|---|---|
| 6,875,981 B2* | 4/2005 | Nishikawa | 850/26 |
| 7,157,702 B2* | 1/2007 | Gribb | 250/310 |
| 7,550,723 B2* | 6/2009 | Kaito | 250/306 |
| 7,683,318 B2* | 3/2010 | Bunton et al. | 250/309 |
| 7,772,552 B2* | 8/2010 | Gribb et al. | 250/309 |
| 8,074,292 B2* | 12/2011 | Bostel et al. | 850/21 |
| 8,153,968 B2* | 4/2012 | Bunton et al. | 250/307 |
| 2006/0113470 A1* | 6/2006 | Gribb | 250/310 |
| 2007/0073364 A1* | 3/2007 | Meissner et al. | 607/88 |
| 2007/0176099 A1* | 8/2007 | Kaito | 250/306 |
| 2010/0116985 A1* | 5/2010 | Bunton et al. | 250/307 |
| 2010/0294928 A1* | 11/2010 | Bunton et al. | 250/307 |

FOREIGN PATENT DOCUMENTS

| | | |
|---|---|---|
| JP | 2005-290510 A | 10/2005 |
| JP | 2006-260780 A | 9/2006 |
| JP | 2007-273401 A | 10/2007 |

* cited by examiner

Primary Examiner — David A Vanore
(74) Attorney, Agent, or Firm — Baker & Hostetler LLP

(57) ABSTRACT

A tomographic atom probe uses electrical pulses applied to an electrode in order to carry out evaporation of the sample being analyzed. In order to produce these electrical pulses, the tomographic atom probe comprises a high-voltage generator connected to an electrode by an electrical connection comprising a chip of semiconductor material. The probe also comprises a light source which can be controlled in order to generate light pulses which are applied to the semiconductor chip. Throughout the illumination, the chip is rendered conductive, which puts the high-voltage generator and the electrode in electrical contact so that a potential step is applied to the latter. The probe also comprises means for applying a voltage step of opposite amplitude to the previous step at the end of a time interval $\Delta t_0$, so that the electrode finally receives a voltage pulse of duration $\Delta t_0$.

11 Claims, 6 Drawing Sheets

TOMOGRAPHIC ATOM PROBE COMPRISING AN ELECTRO-OPTICAL GENERATOR OF HIGH-VOLTAGE ELECTRICAL PULSES

CROSS-REFERENCE TO RELATED APPLICATIONS

This application is a National Stage of International patent application PCT/EP2009/063346, filed on Oct. 13, 2009, which claims priority to foreign French patent application No. FR 08 06550, filed on Nov. 21, 2008, the disclosures of which are incorporated herein by reference in their entirety.

FIELD OF THE INVENTION

The invention relates to the general field of high-voltage pulse generators. It more particularly relates to the pulse generators used to cause evaporation of atoms from a sample of material placed in a tomographic atom probe with a view to its analysis.

BACKGROUND OF THE INVENTION

An essential characteristic of a tomographic atom probe is the value of the mass resolution which can be obtained with this probe. The mass resolution of an atom probe is an essential quality which characterizes in particular:

the capability of the probe to unambiguously separate the various mass peaks of the different isotopes of the elements constituting the material to be analyzed. This ability to discriminate is commensurately more valuable when it relates to neighboring mass peaks with very different amplitudes.

the capability of the probe to increase the measurement accuracy of the composition of the material being analyzed, for example an alloy, by reducing the incorporation of detection noise at a mass peak corresponding to an element of the material being analyzed.

The mass resolution is expressed in the form of a ratio R=m/dm, where m represents the mass corresponding to the peak (i.e. to the element) in question, and where dm represents the width of the mass peak for an amplitude relating to this given peak. If m is equal to 28 and dm is equal to 0.28, for example, for h=0.5 (width at half height), then R=100 at half height.

Consequently, the problem posed for manufacturers of such probes, which constitute time-of-flight mass spectrometers, is to obtain the best possible spectral resolution. Obtaining a good mass resolution involves controlling the motion speed of the material particles from the sample from which they are detached, generally in ionic form, to the detector. In other words, the problem posed consists, as is known, in finding a way of making it possible for the atoms evaporated in the form of ions to be detached from the sample with the same initial potential energy and for them then to travel substantially at the same speed to the detector.

As is also known, the input of potential energy necessary for detaching a few atoms of an atomic layer of the sample is carried out by applying a voltage pulse of high value (high-voltage pulse), the duration of which is in practice of the order of one nanosecond, in the sample extraction zone (the tip).

This voltage and the curvature of the end of the sample are sufficient to create an electric field whose strength is enough to obtain the "field-effect evaporation" phenomenon, an effect which is known to the person skilled in the art. In practice, however, the production of a pulse quasi-instantaneously reaching the theoretical potential level required and constantly maintaining this level for a given time, before likewise ending almost instantaneously, constitutes a genuine real problem in the current state of the art. Consequently, pulses whose upper part has an approximately parabolic shape are generally produced, which leads to a degradation of the mass resolution when such pulses are used in a tomographic atom probe. Varying the amplitude of the pulse applied to the sample during the evaporation and then during the first few nanometers of the trajectory of the emitted ions, thus leads to the appearance of an energy (velocity) spectrum which is fairly broad instead of a single energy line. The spectral resolution of the atom probe is therefore contingent on the capacity to produce a square-wave pulse with a high amplitude and steep edges.

FIGS. 1 and 2 illustrate this dependency by simulated mass histograms for a tomographic atom probe or "Watap" according to the acronym for "wide angle tomographic atom probe", the simulated probe having a given flight length of 0.11 m.

FIG. 1 illustrates a typical favorable case, taken by way of example, in which the evaporation pulses are square-wave pulses having a plateau of 200 ps and edges of 50 ps.

FIG. 2 in turn illustrates the less favorable case, in which the evaporation pulses are square-wave pulses having a plateau of 200 ps and edges of 1000 ps.

Both the presence of a peak 11, 21 having a certain width and the presence of a tail 12, 22, which is more extended but of lower level, can be seen in each of the figures. The peak here corresponds to the evaporation produced when the evaporation pulse has reached its maximum level (plateau of the pulse), while the tail in turn corresponds to the evaporation produced during the time intervals corresponding to the leading and trailing edges, and for which a loss of energy of the evaporated ions is observed.

Consequently, knowing that the relative amplitudes and durations of the peak on the one hand, and the tail (part of the pulse lying after the peak) on the other hand, characterize the resolution of the probe in question, and that the higher the amplitude of the peak and the smaller its width are, the greater the resolution of the probe is, it can be seen from FIG. 2 that extension of the rise and fall times of the pulse leads to a degradation of the resolution. In other words, the closer the evaporation pulse approximates a square-wave shape the higher the resolution of the probe can be.

In order to limit this problem, manufacturers are looking for ways of producing a constant amplitude plateau with steep edges, that is to say very short rise and fall times (typically less than 100 ps) for very short pulses (typically less than 500 ps). The known prior art proposes various approaches for producing such high-voltage pulses.

For instance, there are high-voltage pulse generation devices using a relay wetted with mercury. The repetition frequency of the pulses produced by such devices, of relatively old design, is however extremely low (of the order of one hundred hertz) in view of the desired characteristics, which makes the analysis of the sample relatively slow.

There are also semiconductor devices, of more recent design, which make it possible to produce short-duration pulses whose amplitude can be set in a wide voltage range, typically between a voltage of close to 0 V and a voltage of 4 kV. These devices moreover make it possible to obtain repetition frequencies extending up to a few tens of kilohertz.

However, these performances are obtained at the cost of a degradation of the rise and fall times, that is to say the steepness of the edges of the pulses produced in this way. In the current prior art, such devices therefore do not make it possible to produce high-voltage square-wave pulses of short duration, that is to say pulses having steep edges (typically less than 100 ps) and a short (typically less than 500 ps) maximum of constant level.

There are furthermore pulse generator systems capable of producing pulses having the desired temporal characteristics, but a lower amplitude which is fixed or difficult to adjust. These systems are therefore unsuitable or not very suitable for use in the scope of a tomographic atom probe which, by its nature, is intended for the analysis of different materials, each material requiring the production of pulses whose voltage value is proportional to the high voltage which polarizes the sample.

No known device of the prior art, therefore, is generally satisfactory in the context of producing atom probes with high mass resolution.

SUMMARY OF THE INVENTION

It is an object of the invention to resolve the specific problem of producing high-voltage pulses having the characteristics described above and thus to make it possible to improve the mass resolution of tomographic atom probes.

To this end, the invention relates to a tomographic atom probe having means for applying an electrical evaporation pulse of amplitude $V_p$ and duration $\Delta t_0$ to a sample which is placed at a potential $V_0$. According to the invention, these means comprise:

an electrode which is placed at an initial potential $V_i$ and is configured and arranged to apply the electrical pulse to the sample;

a voltage generator capable of producing the voltage necessary for producing a pulse of amplitude $V_p$, the voltage generator being connected to the electrode by means of an electrical connection which can be open or closed;

means for causing closure of the electrical connection in a given time $\tau$ so as to apply a voltage step $V_p$ to the electrode, these means comprising a chip of semiconductor material placed on the electrical connection between the generator and the electrode, in the vicinity of the electrode, and a first source emitting light pulses of wavelength $\lambda_1$ to the semiconductor chip, said chip becoming conductive and closing the electrical connection when it is illuminated with a light pulse of wavelength $\lambda_1$, the conduction time being a function of the duration of the light pulse applied;

means for applying a voltage step of amplitude $(-V_p)$ to the electrode at the end of a time $\Delta t_0$ after closure of the electrical connection, so as to place the electrode at the potential $V_i$, said means being configured so that the voltage step is applied in a time $\tau'$ substantially equal to $\tau$.

According to a particular embodiment of the tomographic atom probe according to the invention, the means for applying a voltage step of amplitude $-V_p$ to the electrode at the end of a time $\Delta t_0$ after closure of the circuit consist of a transmission line with a characteristic impedance $Z_c$ connecting the generator to the chip, terminated downstream of the electrode by an impedance equal to $Z_c$.

According to this particular embodiment, the length $L_0$ of the transmission line is determined by the value of the time interval $\Delta t_0$ in question, which time interval is equal to the duration of the electrical pulse produced.

According to another particular embodiment of the tomographic atom probe according to the invention, the means for applying a voltage step of amplitude $-V_p$ to the electrode at the end of a time $\Delta t_0$ after closure of the circuit consist in a second source emitting light pulses of wavelength $\lambda_2$ onto the semiconductor chip, said chip becoming insulating and opening the electrical connection when it is illuminated with a light pulse of wavelength $\lambda_2$.

According to this particular embodiment, the time interval $\Delta t_0$ between the emission of a light pulse of wavelength $\lambda_1$ and the emission of a light pulse of wavelength $\lambda_2$ determines the duration of the electrical pulse produced.

According to a particular embodiment of the tomographic atom probe according to the invention, the electrode on which the electrical pulse is produced is positioned facing that end of the sample on which the evaporation is expected.

According to another particular embodiment of the tomographic atom probe according to the invention, the electrode on which the electrical pulse is produced consists of the sample itself.

The device according to the invention makes it possible to form electrical pulses, in particular high-voltage pulses, having extremely short rise and fall times typically of the order of a few picoseconds. This method also makes it possible to control and keep constant the maximum amplitude of this pulse through the duration of the voltage plate. It also makes it possible to create electrical evaporation pulses whose particular shape makes it possible to optimize the mass resolution of the atom probe, and in particular its wide angle variant.

BRIEF DESCRIPTION OF THE DRAWINGS

The characteristics and advantages of the invention will be better understood from the following description, which explains the invention using particular embodiments taken as nonlimiting examples and referring to the appended figures, in which.

DETAILED DESCRIPTION

Figure 4:
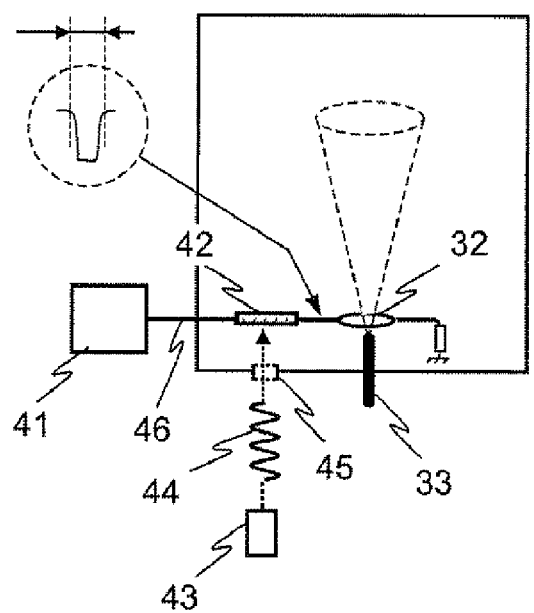
FIG. 4 represents a schematic diagram similar to the diagram of FIG. 3, illustrating the general operating principle of the device according to the invention with reference to a preferred embodiment.

As illustrated in the schematic diagram of FIG. 4, the electrical pulse generator device according to the invention comprises firstly a voltage generator 41 capable of producing the voltage necessary for producing a pulse of amplitude $V_2$ at an electrode 32, which pulse, in view of the potential at which the sample is placed, makes it possible to cause evaporation thereof. This voltage generator is connected to the electrode 32 by means of an electrical connection 46 which can be open or closed.

The device according to the invention also comprises means for causing closure and opening of the connection 46, so as to apply a voltage step $V_2$ to the electrode and place the potential of the electrode, initially equal to a value $V_1$, at $V_1+V_2$. The means for causing closure of the connection 46 comprise a controlled switch inserted into the electrical circuit between the generator 41 and the electrode 32, in the vicinity of the electrode, and means for controlling this switch.

A preferred, but not exclusive, embodiment of these means consists in using a chip of semiconductor material 42 installed on the circuit connecting the high-voltage generator 41 and the electrode 32 to which the electrical pulse is applied.

The means for actuating the switch constituted by the chip of semiconductor material 42 are a light source 43, for example a laser source, delivering short pulses 44, typically of less than 100 ps, and of high intensity. The length $\lambda_1$ of the pulses emitted by the light source 43 is determined as a function of the semiconductor used to form the chip 42. The energy contained in each pulse, typically of the order of 10 microjoules, is moreover sufficient to set the semiconductor chip in conduction.

According to the invention, the assembly is arranged so that the chip 42 is illuminated by the light source 43. To this end, the light pulses 44 are applied to the semiconductor chip 42 either directly through a transparent window 45 or by means of an optical fiber or any other means.

Thus, by applying a light pulse of determined duration to the chip of semiconductor material, the conduction of the chip is made to develop naturally. First, the chip changes in a brief time $\tau$ from the insulating state to the conducting state. It subsequently remains in the conducting state throughout the light pulse. Then, after the light pulse is extinguished, the chip returns progressively to the insulating state at the end of a time $\tau'$.

Setting the chip of semiconductor material in conduction leads to the appearance of a voltage step on the electrode, which is then put at the voltage $V_1$. Conversely, the return of the chip to the non-conduction state leads to the appearance of an opposite voltage step on the electrode, which is then put at the inactive potential $V_0$. An electrical pulse is thus produced on the electrode, the duration of which depends on the duration of the light pulse applied and the characteristics of the semiconductor constituting the chip. Such a pulse can therefore advantageously be very short.

It should however be noted that with such a structure, the time $\tau'$ for return to the insulating state is very substantially greater than the time $\tau$, simply because the time taken to create free carriers within the semiconductor material when it is illuminated is much less than the time $\tau'$ taken to eliminate these carriers when the illumination ends. Furthermore, this time t' cannot be modified by any external means. Consequently, although much shorter than those produced by the means generally employed, the duration of the electrical pulse produced cannot be completely controlled.

This is why, further to the elements presented in FIG. 4, the device according to the invention incorporates additional means allowing the width of the electrical pulse produced on the electrode to be controlled perfectly, despite the fact that the time for return to the insulating state of the chip of semiconductor material, which acts as a switch here, cannot be completely determined.

The action of these means consists in applying a voltage step of amplitude $-V_1$ to the electrode at the end of a time $\Delta t_0$ after the circuit is closed, that is to say in the preferred embodiment after the chip is set in conduction, so as to place the potential of the electrode quasi-instantaneously at $V_0$. In this way, it is possible to obtain an electrical pulse whose duration can be shorter (of the order of one hundred picoseconds) than that of the pulses produced with conventional pulse generators, and whose leading and trailing edges are extremely steep (a few picoseconds) and have comparable or even substantially equal durations.

It should be noted that such means, which act directly on the potential at which the electrode is placed, may advantageously be associated with a wide variety of means for causing closure and opening of the connection 46. The advantage offered by using such means is therefore not limited to the particular case of the preferred embodiment described above, in which these means consist of a chip of semiconductor material and a source producing light pulses.

From a physical point of view, in the preferred embodiment of the device according to the invention, the high-voltage pulses are therefore produced by means of one or more chips of semiconductor material 42 (silicon, germanium, gallium arsenide or the like) with a direct or indirect gap. Such elements, which are known for their electro-optical properties, become conductive for a short time under the effect of a brief and intense light pulse 44, coming for example from a femtosecond pulse laser generator. Consequently, the wavelength $\lambda_1$ of the light pulse 44 is selected in order to generate free charges by photoconduction in the semiconductor material. In other words, the energy of the emitted photons is determined so as to be greater than the gap of the material used.

In this way, when this chip of material 42 is not illuminated, its electrical resistance remains high, of the order of one hundred megohms. Conversely, when the chip is illuminated by an intense light pulse 44 emitted by the source 43, a large number of free charges or carriers are released within the chip 42 by the photoconduction effect. The chip then changes from an impedance of a few megohms to a few ohms in a very short time, typically less than one hundred picoseconds. The then becomes conductive. The time for which the device is conductive (conduction time), which corresponds to the lifetime of the free carriers, furthermore depends on the thickness of the chip, the nature of the semiconductor material used and the time for which the semiconductor is illuminated, or more generally the light energy received.

The geometry of the semiconductor chip 42 is in practice selected in order to avoid reaching the breakdown voltage of the material, knowing that it is necessary to be able to establish a voltage of a few kilovolts between the two ends of the chip when it is in the insulating state (open switch). This breakdown voltage is a constant of the semiconductor material, equal for example to $3 \cdot 10^5$ V/cm for silicon and $4 \cdot 10^5$ V/cm for gallium arsenide. A sufficient thickness is therefore necessary. Conversely, in order to be able to work at high pulse generation frequencies, it is preferable for the chip to change very rapidly from the insulating state to the conducting state and from the conducting state to the insulating state. This involves using a chip 42 of small thickness. Consequently, the choice of the thickness to be given to the chip 42 results from a compromise which is in particular a function of the material used, the conduction time of the chip depending in particular on the nature of the material (recombination time of the photo-induced carriers).

Figure 5:
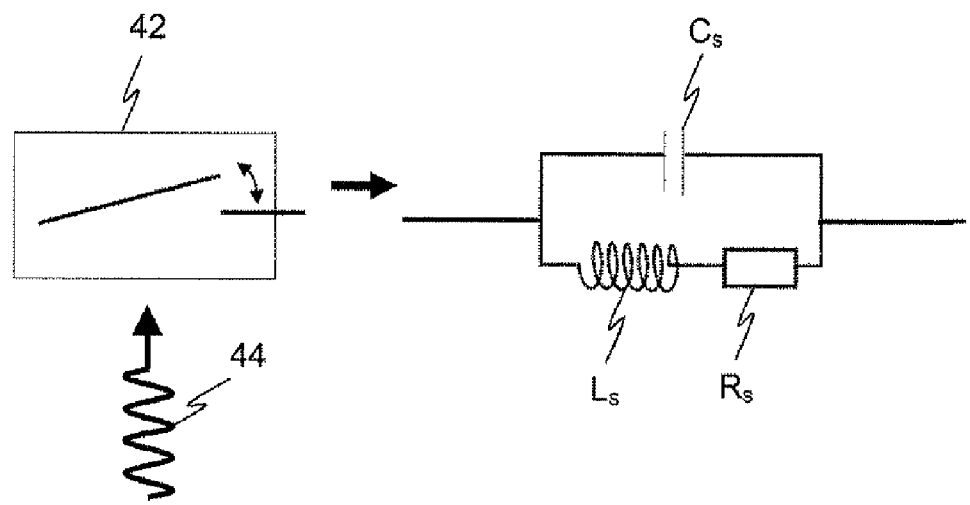
FIG. 5 shows an equivalent circuit diagram of the sample tip/back electrode assembly in an atom probe.

From the point of view of its operation, the chip 42 itself constitutes a circuit of the RLC type, illustrated by FIG. 5, for which the resistance $R_S$ varies from a few megohms when the chip is not illuminated (open state of the switch) to a few ohms when it is illuminated (closed state of the switch). The capacitance $C_S$, typically of the order of one picofarad, is a function of the geometry of the chip. The inductance $L_S$ is in turn of the order of a few tens of picohenries. This chip therefore represents a resonant circuit, the resonant frequency $v_S$ ($v_S \propto \sqrt{L_S \cdot C_S}^{-1/2}$) of which is typically a few tens of gigahertz. The resistance $R_S$ should consequently be adjusted with the aid of the intensity of the light beam applied to the chip in order to suppress any parasitic oscillation, so as to be able to produce a pulse having as constant a voltage plate as possible. However, by maintaining a non-zero resistance when the chip is conductive, the rise time is degraded by a few picoseconds.

Figure 1:
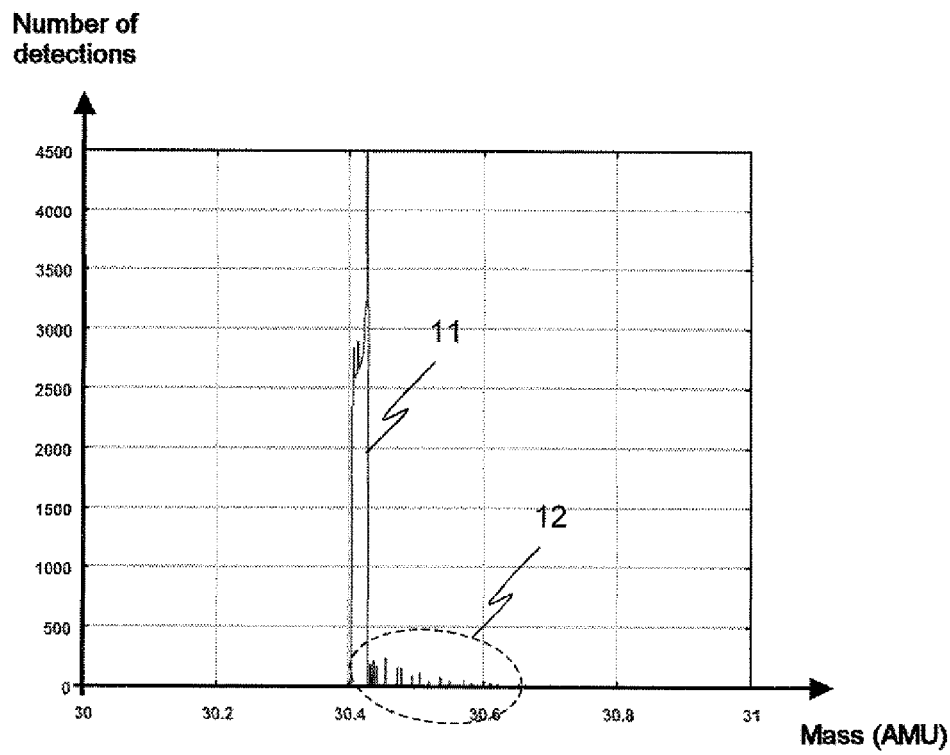
FIGS. 1 and 2 show two mass histograms presented as illustrations of the resolution problem posed by the electrical evaporation pulse production devices of existing atom probes.
Figure 2:
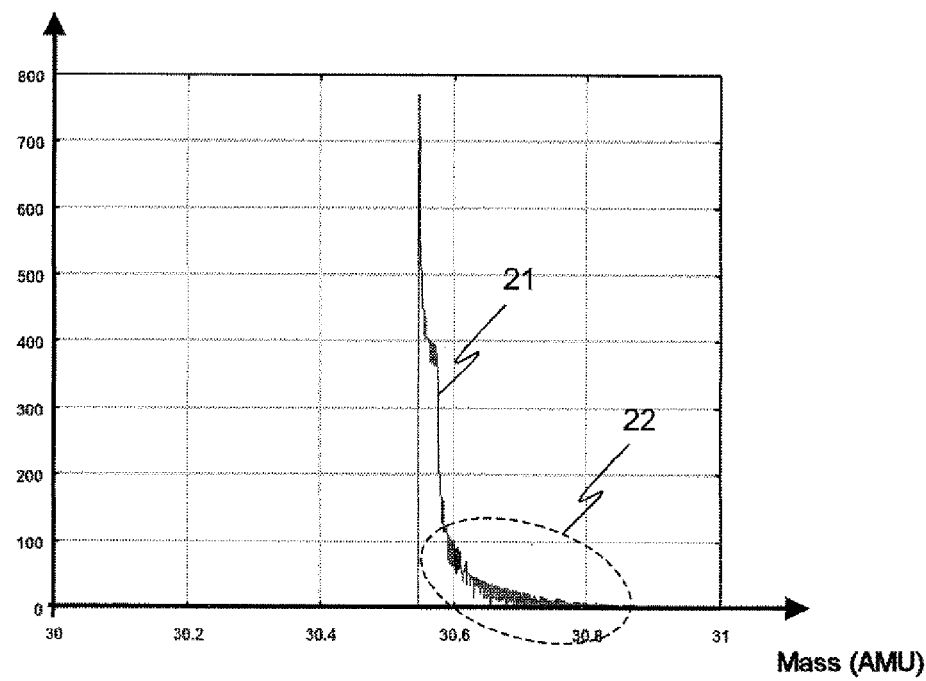
Figure 3:
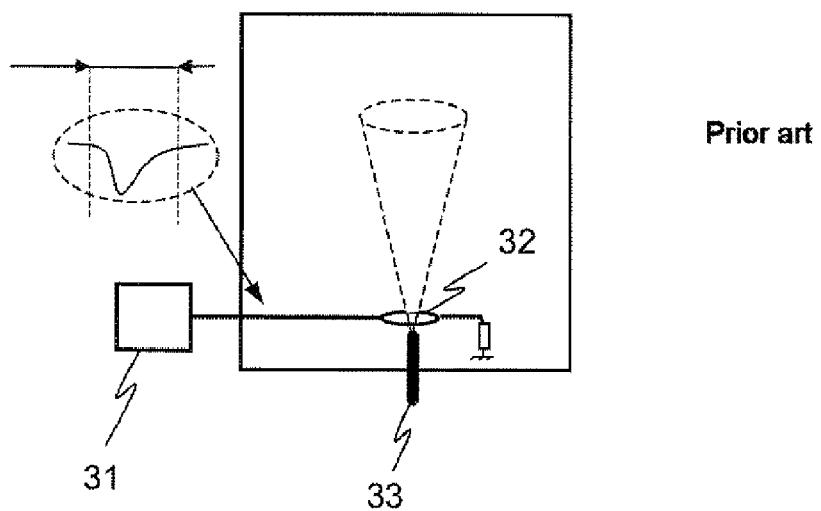
FIG. 3 shows a schematic diagram illustrating the way in which the electrical evaporation pulses are generally produced in an atom probe according to the known prior art.

According to the invention, the chip of material 42 is therefore directly in charge of forming the electrical pulses produced, so that unlike the generator 31 with which a conventional device is equipped, the principle of which is illustrated by FIG. 3, the generator 41 is a DC voltage generator, or a generator delivering wide pulses which will be chopped by the switch constituted by the chip 42.

It should be noted that the conduction time of the chip 42, and the development of the conductivity of the chip during the conduction time, determine the maximum width of the electrical pulse applied to the sample. This duration is in particular a function of the duration of the light pulse 44 and the nature of the material of the chip. Furthermore, the minimum rise time of the pulse is in turn a function on the one hand of the creation rate of free carriers, and on the other hand the structure of the electronic circuit within which the device is inserted. In this way, by adopting the appropriate structure, a minimal rise time of the order of a few picoseconds can advantageously be obtained.

Furthermore, the lifetime of the free carriers within the chip 42 determines the maximum fall time of the electrical pulse. Consequently, the precise duration of the pulse as well as that of the fall time are controlled by virtue of complementary means. The rate of disappearance of the free carriers may nevertheless be increased, in certain applications such as the one illustrated by FIG. 12 and described below in the description, by applying a second light pulse to the chip 42, this second light pulse having a wavelength v' different to that used to set the chip in conduction. The aim in this case is to obtain an electrical pulse having a trailing edge with a duration of the order of that of the leading edge.

The wavelength of the light pulse 45 is moreover selected, as a function of the material used, so as to produce the photoconductor effect. The light intensity of the source 43 used should also be selected in order to sufficiently reduce the electrical resistance of the chip when it is in the conducting state (closed switch).

Thus, owing to the size of the pulses generated and the steepness of the leading and trailing edges which it is possible to obtain, the device according to the invention, particularly in the preferred embodiment more particularly described in the text above, advantageously replaces the electrical pulse generator devices conventionally used for atom probes (cf. FIG. 3).

Furthermore, the use of a chip of semiconductor material as a switch makes it possible to integrate the switching part of the device produced in this way directly into the vacuum chamber of the probe, so that the switch can advantageously be placed in the immediate vicinity of the application point of the pulse. The adaptation of the switching circuit, and consequently the shape of the pulse produced, can thus be controlled better.

Figure 6:
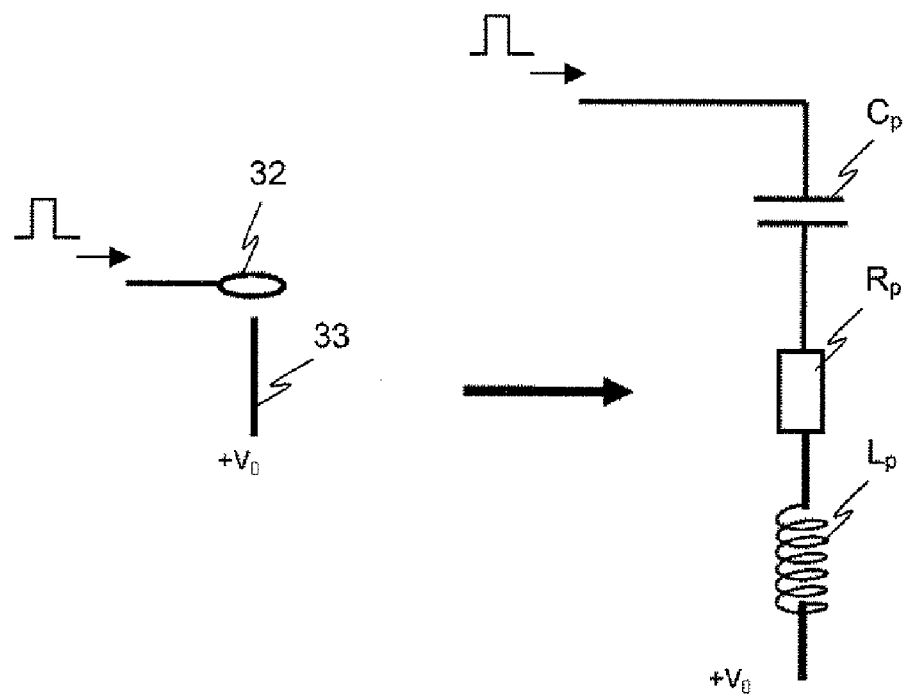
FIG. 6 shows an equivalent circuit diagram of the semiconductor chip fulfilling the function of a controlled switch in the preferred embodiment of the device according to the invention.

The variants of the device according to the invention in the preferred embodiment, for use as an evaporation pulse generator within an atom probe, are widespread and depend in particular on the arrangement of the electrode 32 with respect to the sample 33 and the way of producing the overall electrical connection 46 making it possible to convey the electrical pulse produced to the electrode 32 and to the sample 33. Various alternative embodiments are presented by way of nonlimiting examples in the description below. These alternative embodiments take into account particularly the fact that the assembly formed by the back electrode and the sample tip constitutes a circuit of the RLC type, illustrated by FIG. 6, the resistance $R_p$ of which varies from substantially zero ohms to one thousand megohms and the capacitance $C_p$ and inductance $L_p$ of which are respectively of the order of one hundredth of a picofarad and of the order of one nanohenry. This circuit has a resonant frequency $v_p$ ($v_p \propto \sqrt{L_p \cdot C_p}^{-1/2}$) whose characteristic time is of the order of 1 to 5 ps. The device according to the invention should consequently make it possible to produce pulses whose leading and trailing edges have durations greater than this value, in order to avoid any resonant oscillation.

FIGS. 7 to 10 illustrate a first variant of the device according to the invention, as well as the general operating principle of the invention.

Figure 7:
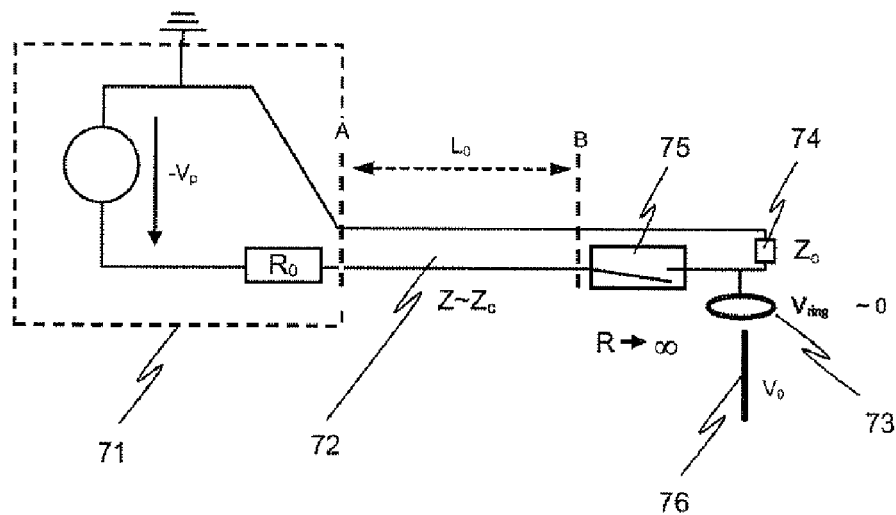
FIGS. 7 to 10 show illustrations relating to a first preferred alternative embodiment of the device according to the invention.
Figure 8:
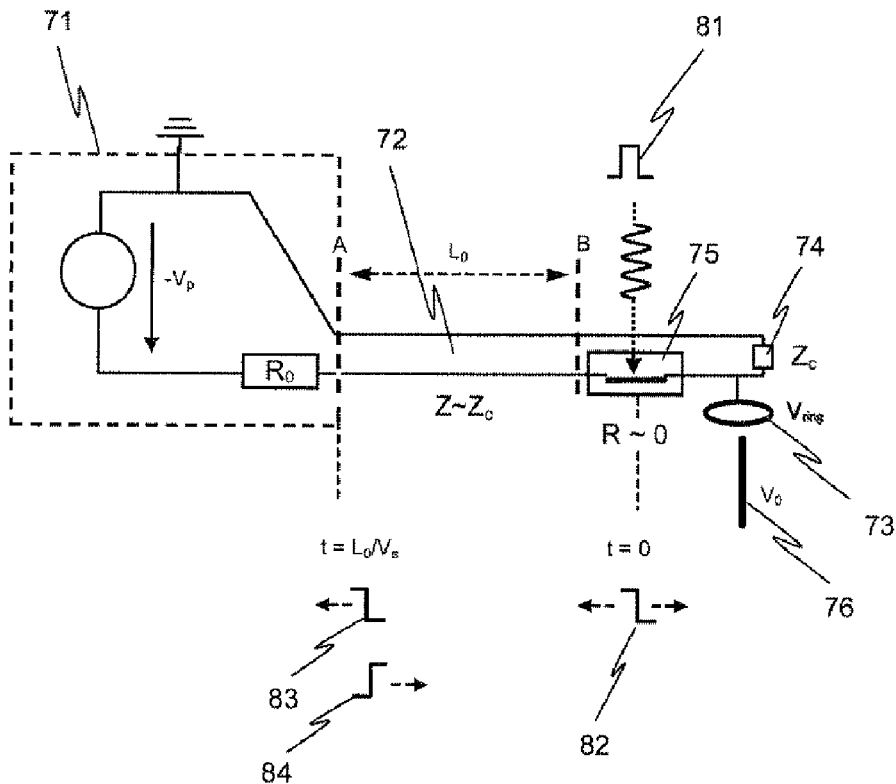

FIGS. 7 and 8 schematically present a first embodiment of the device according to the invention and allow its operation to be detailed. This first embodiment, as well as the other embodiments presented in the description below, are of course presented by way of nonlimiting examples.

In this alternative embodiment, a voltage generator 71 of impedance $R_0$ is connected to a ring-shaped electrode 73 by means of a transmission line 72 of length $L_0$. The electrode is placed facing the end of the sample 76 to be analyzed, which sample is in the form of a tip, itself placed at a potential $V_0$.

The semiconductor chip 75 is placed at the base of the ring 73, which is connected to a load impedance $Z_c$, 74, that closes the line 72.

The propagation line 72 has a characteristic impedance equal to the load impedance $Z_c$, 74, typically of the order of one hundred ohms, while the value of the resistance $R_0$ of the generator 71 is selected in order to maximize the reflection of the voltage waves. The value of $R_0$ is furthermore less than the impedance $R_{off}$ of the chip 75 in the nonconductive state, typically a few megohms, so as to obtain a maximum voltage across the terminals of the chip. The relationship between the various impedances is therefore established as follows:

$$R_0 \gg R_{off} \gg Z_c$$

The field-effect evaporation of a few atoms of the sample 76 takes place when the ring 73, initially at a potential close to the reference potential, is placed at a negative value with respect to this reference. Control of the evaporation process, on which the resolution of the probe is contingent, requires that this potential is only applied to the ring for a very brief instant, so that only a few atoms are evaporated.

FIG. 7 presents the device in the absence of stimulation. The semiconductor chip 74 is then nonconductive, so that it has a high impedance $R_{off}$. The ring 73 is then in turn placed at a potential substantially equal to the reference potential, for example the ground potential ($V_{ring} \sim 0$). In this way, the sample 76 being placed only at the potential $V_0$, no evaporation takes place.

FIG. 8, on the other hand, presents the device in the presence of stimulation. This stimulation takes the form of a light pulse which triggers the device by making the chip 75 of semiconductor material conductive so that the latter then has a resistance $R_{on}$ of low or very low value for a given time.

Consequently, this variation in the value of the resistance R of the chip 75 leads to the appearance at a time $t_0$ of a voltage step 82 of value V which propagates along the line, with a velocity $v_s$, in the direction of the generator 71 on the one hand and in the direction of the load $Z_c$, 74, on the other hand. In view of the fact that the impedance of the chip 75 is substantially zero and the values of the load impedance 74 and the characteristic impedance of the line 72 are substantially equal to the same value $Z_c$, the amplitude V of the voltage step is substantially equal to $-V_p/2$. Moreover, the rise time τ of this step is directly a function of the time taken by the material to become conductive under the effect of the light pulse. It is of the order of one picosecond.

When arriving at the input of the generator 71, the voltage step 83 is reflected at $R_0$ and, in view of the high value of the resistance $R_0$ with respect to that of the impedance $Z_c$, produces a step 84 of opposite sign with an amplitude substantially equal to $V_p/2$, which in turn propagates along the line 72 so that, after a time Δt substantially equal to $2 \cdot L_0/vs$, vs representing the propagation velocity of the signal along the line 74, the incident step 83 and the reflected step 84 are added together at the ring 73. The voltages applied to the ring 73 then cancel each other in a time (fall time) equivalent to the rise time. Consequently, because of the length $L_0$ of the line 72 and the fact that the ring is located in the vicinity of the chip 75, the ring 73 receives first a voltage step V with a rise time τ then, at the end of the time $\Delta t_0$, an opposite voltage step $-V$ with a fall time also equal to τ. A pulse of amplitude $-V_p/2$ and duration $\Delta t_0$ having leading and trailing edges of duration τ is thus applied to the ring 73.

It should be noted that the values of the parameters τ and $\Delta t_0$ which define the shape and the duration of the pulse applied to the ring 73 can advantageously be controlled. Specifically, the duration τ of the leading and trailing edges is directly a function of the semiconductor material employed and the intensity of the light pulse 81 applied. The duration $\Delta t_0$ is in turn determined by the nature and the length of the transmission line 74.

Figure 9:
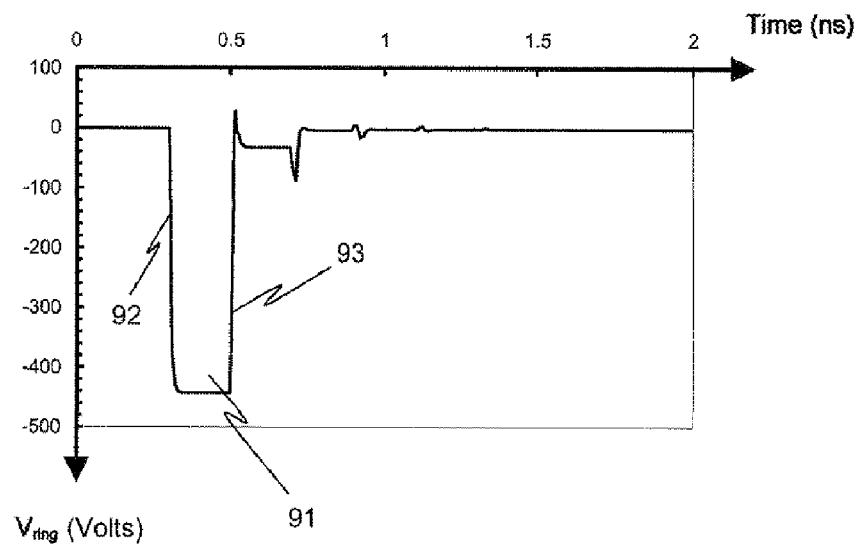
Figure 10:
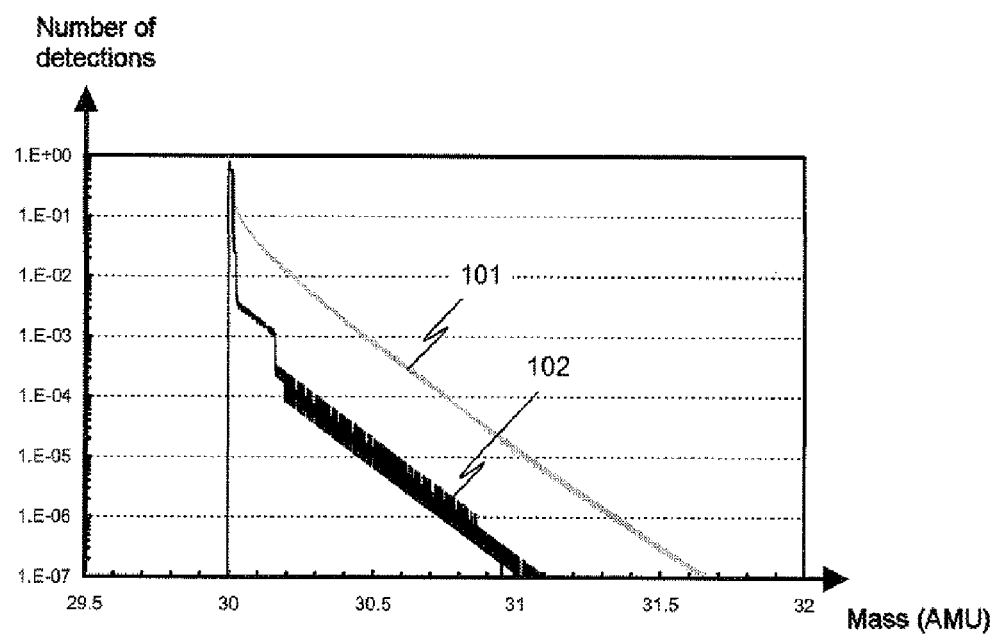

FIGS. 9 and 10 illustrate by simulation results the advantageous effects of using the device according to the invention. For this simulation, the semiconductor chip 75 is modeled by an RLC circuit whose resistance $R_{on}$ under laser illumination is equal to 10 ohms and whose resistance $R_{off}$ without illumination is equal to 1 megohm. The inductance L is set here at $5 \cdot 10^{-12}$ henry and the capacitance C at $10^{-13}$ farad. Furthermore, the voltage $V_p$ delivered by the generator 71 is set at 1000 volts and its resistance $R_0$ at 33 kilohms. Moreover, the impedance $Z_c$ is set at 100 ohms and the length of the transmission line 72 at 2 centimeters. Lastly, the propagation velocity along the line 72 is set at 200 meters per microsecond and the carrier creation time in the semiconductor constituting the chip 75 is set here at 2 picoseconds.

The oscillogram of FIG. 9 shows that when the semiconductor chip is illuminated by a light pulse, with such a device an electrical pulse 91 is produced with a duration substantially equal to 200 picoseconds, having very short leading 92 and trailing 93 edges of equal durations, of the order of a few picoseconds, and an amplitude close to $V_p/2$. It can also be seen that the duration of the pulse produced advantageously depends only on the propagation time of the voltage step along the propagation line 72.

The illustration of FIG. 10 presents on a single diagram, for a homogeneous sample consisting of elements with mass equal to 30 AMU, the mass spectra 101 and 102 obtained respectively by using a pulse generator of known type from the prior art and a pulse generator produced by means of the device according to the invention, as illustrated by FIGS. 7 and 8. As illustrated in the figure, using the device according to the invention advantageously makes it possible to produce pulses whose characteristics improve the overall performance of the atom probe in which it is integrated. This improvement in terms of mass resolution is demonstrated on the figure by attenuation of the base of the spectrum by at least one order of magnitude with respect to the spectrum of the same sample obtained by using known conventional means.

Figure 11:
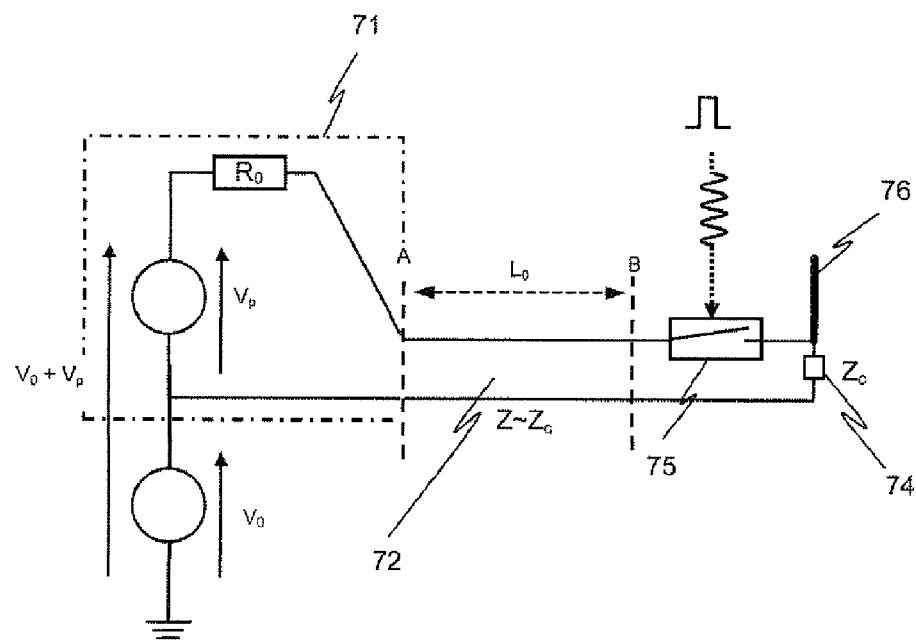
FIG. 11 shows an illustration relating to a second preferred alternative embodiment of the device according to the invention.

FIG. 11 schematically presents a second alternative embodiment of the device according to the invention.

In this variant, the evaporation pulse generator is arranged so that the sample to be analyzed is directly integrated into the assembly instead of the ring electrode 73. The potential reference of the device is placed at the potential $V_0$ applied only to the sample in the previous embodiment, the assembly consisting of the device and the sample thus being placed at a common potential equal to $V_0$.

The voltage generator is furthermore configured in order to deliver a voltage $+V_p$ which can be added to the voltage $V_0$ applied to the sample.

Thus, at rest i.e. in the absence of illumination, the chip of semiconductor material 74 is then nonconductive, so that it has a high impedance $R_{off}$. The sample 76 is then placed at a potential substantially equal to the reference potential $V_0$, so that no melting takes place.

On the other hand, during operation i.e. when the chip of semiconductor material 74 is subjected to illumination and therefore has a very low impedance $R_{on}$, the sample 76 is subjected to a voltage pulse which places it throughout its duration at a potential substantially equal to $V_0+V_p$, which causes the desired evaporation.

In this second alternative embodiment, as in the previous one, the duration of the pulse is determined by the length of the line 72 which makes it possible to apply the voltage delivered by the generator 71 to the sample 76. By using this second arrangement in an atom probe, the same advantages as those obtained by means of the previous arrangement are therefore obtained in terms of resolution.

Figure 12:
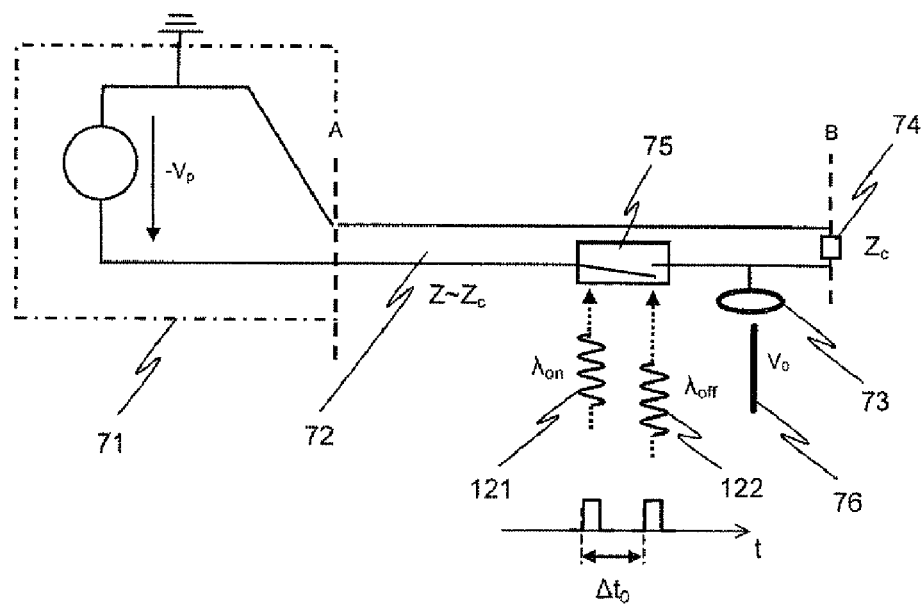
FIG. 12 shows an illustration relating to a third preferred alternative embodiment of the device according to the invention.

FIG. 12 schematically presents a third alternative embodiment of the device according to the invention.

The variant described here differs from the previous ones in that the duration of the electrical pulse produced, as well as the durations of its leading and trailing edges, are obtained simply by acting on the chip of semiconductor material 75.

The chip 75 is rendered conductive ($R=R_{on}$) by applying a first light pulse 121, then is made nonconductive again ($R=R_{off}$) at the end of a time $\Delta t_0$ by applying a second light pulse 122 with a different wavelength to the first light pulse. An electrical pulse of duration $\Delta t_0$ is thus produced.

The action of the first light pulse 121 consists, as before, in creating photo-induced free carriers in the semiconductor material. The second light pulse 122, for its part, acts on the semiconductor by activating the recombination sites of the semiconductor so as to cause quasi-instantaneous destruction of the free carriers. According to this embodiment, the semiconductor material constituting the chip is selected so as to react to the two wavelengths in question.

According to the invention, the time interval $\Delta t_0$ between the two light pulses 121 and 122 is produced by any known means, for example an optical delay line.

An electrical pulse is thus obtained whose duration is a function of the time interval between the two light pulses and whose leading and trailing edges have durations, of the order of a few picoseconds, which depend only on the time taken to make the semiconductor conductive and the recombination time of the free carriers created by the first light pulse.

The invention claimed is:

1. A tomographic atom probe having means for applying an electrical evaporation pulse of amplitude $V_p$ and duration $\Delta t_0$ to an end of a sample which is placed at a potential $V_0$, said tomographic atom probe comprising:
- an electrode which is placed at an initial potential $V_i$ and is configured and arranged to apply the electrical pulse to the sample;
- a voltage generator to produce a voltage necessary for producing a pulse of amplitude $V_p$, the voltage generator being connected to the electrode by means of an electrical connection which can be open or closed;
- means for causing closure of the electrical connection in a given time $\tau$ so as to apply a voltage step $V_p$ to the electrode, these means comprising a chip of semiconductor material placed on the electrical connection between the generator and the electrode, in the vicinity of the electrode, and a first source emitting light pulses of wavelength $\lambda_1$ to the semiconductor chip, said chip becoming conductive and closing the electrical connection when it is illuminated with a light pulse of wavelength $\lambda_1$, the conduction time being a function of the duration of the light pulse applied;
- means for applying a voltage step of amplitude ($-V_p$) to the electrode at the end of a time $\Delta t_0$ after closure of the electrical connection, so as to place the electrode at the potential $V_i$, said means being configured so that the voltage step is applied in a time $\tau'$ substantially equal to $\tau$.

2. The tomographic atom probe according to as claimed in claim 1, wherein the means for applying a voltage step of amplitude $-V_p$ to the electrode at the end of a time $\Delta t_0$ after closure of the circuit consist of a transmission line with a characteristic impedance $Z_c$ connecting the generator to the chip, terminated downstream of the electrode by an impedance equal to $Z_c$.

3. The tomographic atom probe according to claim 2, wherein the length $L_0$ of the transmission line is determined by the value of the time interval $\Delta t_0$ in question, said time interval being equal to the duration of the electrical pulse produced.

4. The tomographic atom probe as claimed in according to claim 1, wherein the means for applying a voltage step of amplitude $-V_p$ to the electrode at the end of a time $\Delta t_0$ after closure of the circuit consist of a second source emitting light pulses of wavelength $\lambda_2$ onto the semiconductor chip, said chip becoming insulating and opening the electrical connection when it is illuminated with a light pulse of wavelength $\lambda_2$.

5. The tomographic atom probe according to claim 4, wherein the emission of a light pulse of wavelength $\lambda_1$ and the emission of a light pulse of wavelength $\lambda_2$ are separated from one another by a time interval $\Delta t_0$, which determines the duration of the electrical pulse produced.

6. The tomographic atom probe according to claim 5, wherein the electrode on which the electrical pulse is produced consists of the sample itself.

7. The tomographic atom probe according to claim 5, wherein the electrode on which the electrical pulse is produced is positioned facing an end of the sample to which the evaporation pulses are applied.

8. The tomographic atom probe according to claim 4, wherein the electrode on which the electrical pulse is produced consists of the sample itself.

9. The tomographic atom probe according to claim 4, wherein the electrode on which the electrical pulse is produced is positioned facing an end of the sample to which the evaporation pulses are applied.

10. The tomographic atom probe according to claim 1, wherein the electrode on which the electrical pulse is produced is positioned facing an end of the sample on which the evaporation pulses are applied.

11. The tomographic atom probe according to claim 1, wherein the electrode on which the electrical pulse is produced consists of the sample itself.

* * * * *